United States Patent [19]

Juang et al.

[11] Patent Number: 6,028,489
[45] Date of Patent: Feb. 22, 2000

[54] MODULAR HIGH-FREQUENCY OSCILLATOR STRUCTURE

[75] Inventors: Shing-Yeu Juang, Taipei; Tseng-Hsin Chiu; Wen-Yuh Liao, both of Taoyuan Hsien, all of Taiwan

[73] Assignee: Chung-Shan Institute of Science and Technology, Taoyuan Hsien, Taiwan

[21] Appl. No.: 09/215,419

[22] Filed: Dec. 18, 1998

[51] Int. Cl.$^7$ .................................................. H01R 43/00
[52] U.S. Cl. ............................ 331/46; 361/792; 361/794; 174/260; 174/261; 29/593; 29/412; 29/413; 29/414
[58] Field of Search ...................... 361/792, 794, 361/760, 761, 762, 780, 818; 438/462, 460; 331/46, 49, 187; 324/500; 174/255, 258, 260, 261, 257, 268; 29/412, 413, 414, 593, 846, 847; 257/691, 700, 728

[56] References Cited

U.S. PATENT DOCUMENTS

5,488,765  2/1996  Kubuta et al. ............................ 29/593

*Primary Examiner*—Arnold Kinkead
*Attorney, Agent, or Firm*—Thomas, Kayden, Horstemeyer & Risley, L.L.P.

[57] ABSTRACT

A modular high-frequency oscillator structure utilizes a master circuit board to form a plurality of oscillator units. The master circuit board has an upper, middle and lower copper foil layer. The upper copper foil layer has a plurality of component circuit patterns and a plurality of positive voltage, ground and signal regulation circuit patterns. The middle copper foil layer has a plurality of power transfer and ground transfer circuit patterns. The lower copper foil layer has a large common ground circuit pattern. The master circuit board is etched in such a manner that the upper and lower copper foil layers are cut through to isolate each oscillator unit and the middle copper foil layer remains uncut.

7 Claims, 8 Drawing Sheets

MODULAR HIGH-FREQUENCY OSCILLATOR STRUCTURE

BACKGROUND OF THE INVENTION

1. Field of the Invention

The present invention relates to the structure for high-frequency oscillators, more particularly, to an oscillator structure having a master circuit board for forming a plurality of oscillator units, each being tested directly without being detached from the master circuit board.

2. Description of Related Art

Figure 4:
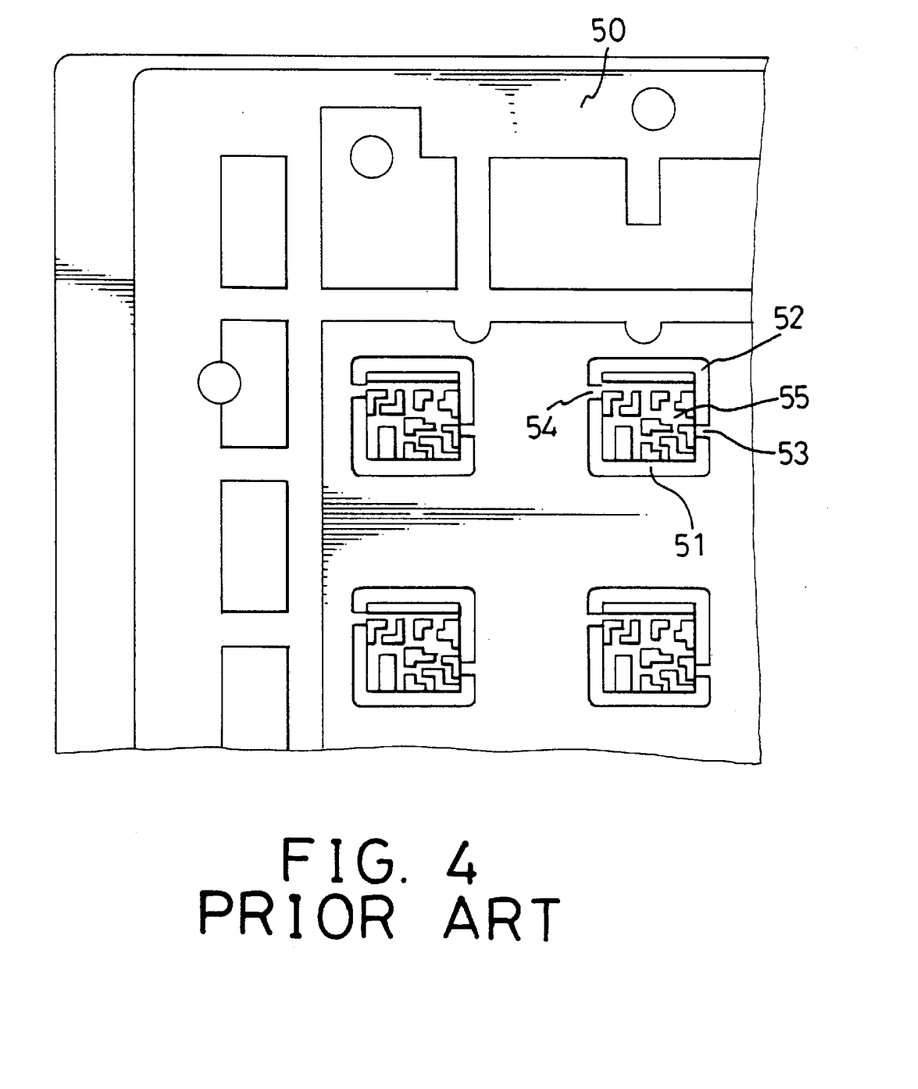
FIG. 4 is a plan view of a first conventional master circuit board to form a plurality of oscillator units.

The high-frequency oscillator, such as a microwave or voltage control oscillator, is usually manufactured as a small piece of a circuit board and covered by a metal mask to avoid parasitic oscillation and interference resulting from the high oscillating frequency. In mass production, a plurality of isolated oscillator units are formed on a large master circuit board, which is then cut to obtain each individual oscillator on a small piece of circuit board. As shown in FIG. 4, a plurality of isolated oscillator units (55) are formed on a master circuit board (50). Two U-shaped apertures (51,52) are defined by piercing the master circuit board (50) around the boundary of each oscillator unit (55) whereby each oscillator unit (55) is only supported by two thin tie bars (53, 54). Afterwards, the tie bars (53,54) can be broken manually to detach each oscillator unit (55) for testing.

Figure 5A:
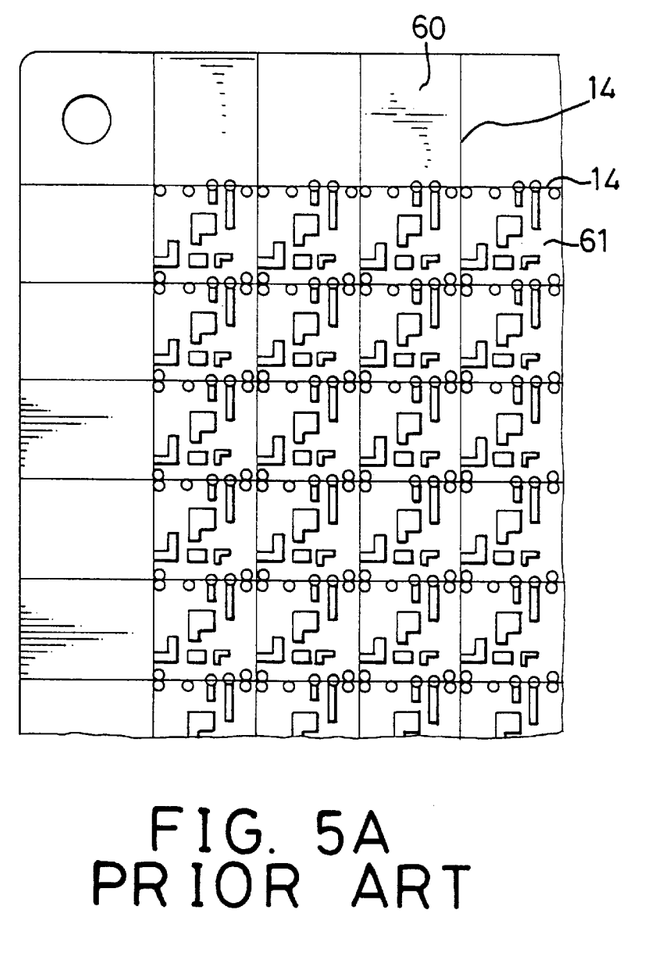
FIG. 5A is a plan view of a second conventional master circuit board for forming a plurality of oscillator units.
Figure 5B:
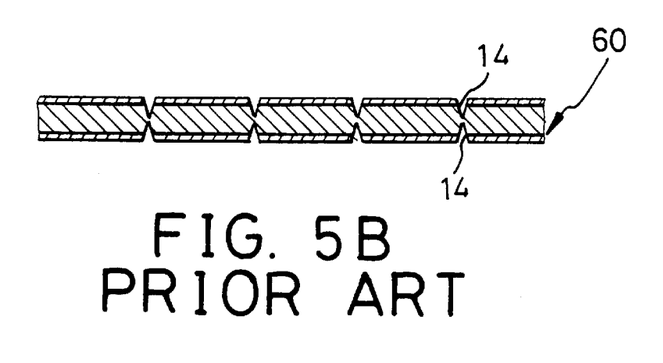
FIG. 5B is a cross sectional view of the second conventional master circuit board for forming a plurality of oscillator units.

Referring to FIG. 5A, another conventional master circuit board (60) for manufacturing high-frequency oscillators is shown. A plurality of identical oscillator units (61), arranged in a matrix form, are formed on the master circuit board (60). Each one of the plurality of oscillator units (61) is isolated by a plurality of intersected vertical and horizontal etched grooves (14) defined by using an etching knife device with a V-shaped knife edge. FIG. 5B is a cross sectional view of the master circuit board (60), which further shows that the etched grooves (14) are defined in both faces of the master circuit board so that two adjacent oscillator units (61) are loosely tied together. Afterwards, the master circuit board (60) can be easily broken along the etched grooves (14) to obtain the plurality of oscillator units (61) for testing.

Figure 6:
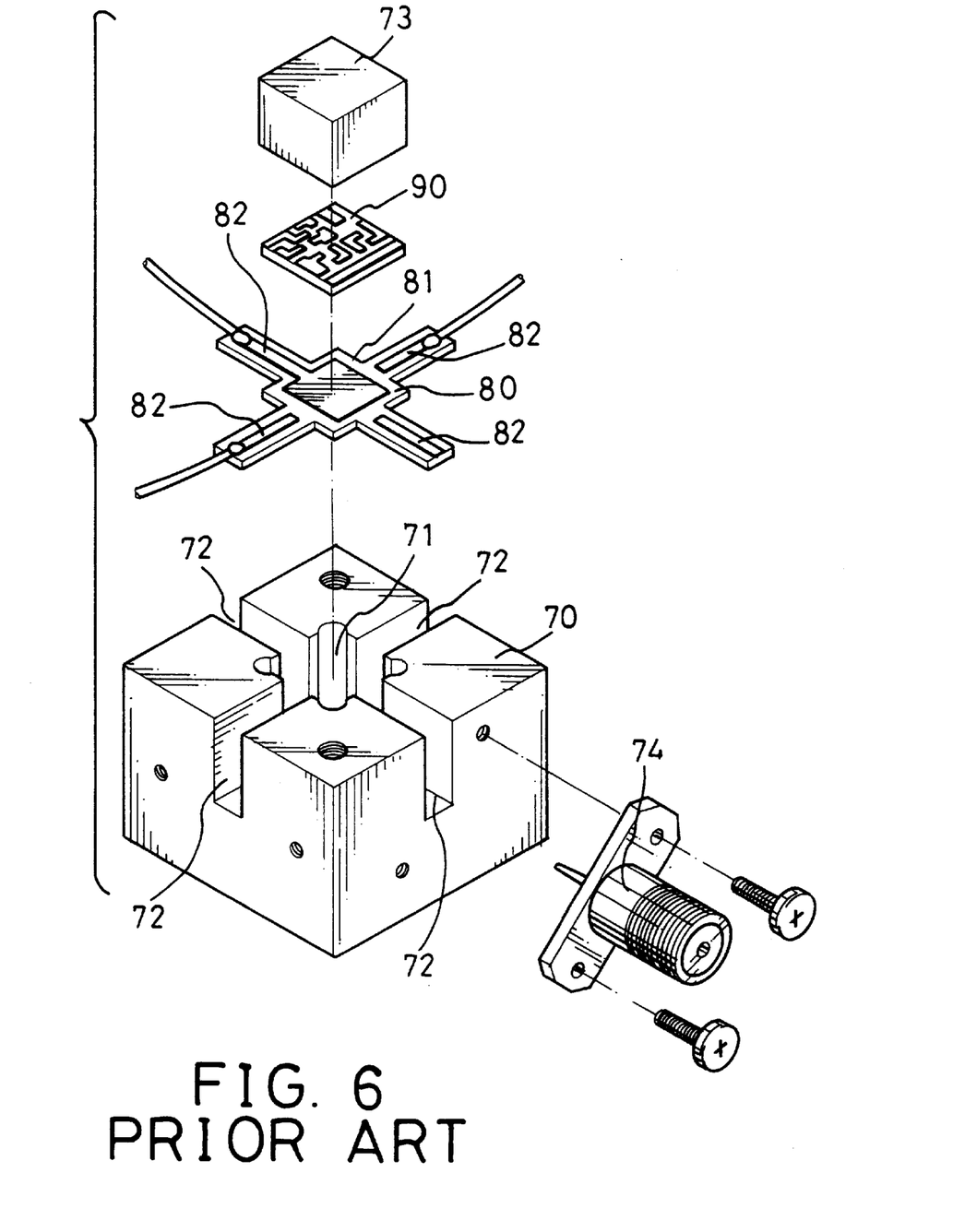
FIG. 6 is an exploded view of a conventional test seat for testing an oscillator unit.

The test to the oscillator units (55,61) formed on a small piece of circuit board and detached form the master circuit board (50,60) as described above is complicated because all the oscillator units (51,61) have to be tested one by one, and each test is inconvenient to implement. Each oscillator unit (55, 61) has to be tested in a test seat (70) specifically configured to hold an oscillator unit (90), as shown in FIG. 6. The test seat (70) has a position slot (71) defined therein to hold the to-be-tested oscillator unit (90). Each side of the test seat (70) defines a pass slot (72) communicated with the position slot (71) for positioning cables and a signal connector (74). Furthermore, a thin circuit board (80) having a shape fitted to the position slot (71) and pass slots (72) has to be provided to stick into the test seat (70). The thin circuit board (80) has several copper foil contacts (82) and a copper foil ground (81) formed on the surface. The external terminal of each copper foil (81,82) is used to electrically connect with power lines, signal wires, or the signal connector (74). The internal terminal of each copper foil (81,82) is used to electrically connect to the oscillator unit (90) under test thereby supplying power and transmitting signals to the oscillator unit (90) to obtain output signals from the signal connector (74) to perform tests. In addition, when a test is to be performed, a rubber block (73) has to be inserted into the position slot (71) after the oscillator unit (90) is positioned therein thereby forcing the oscillator unit (90) to make and maintain secure contact with the thin circuit board (80) to ensure effective electrical contact. Accordingly, it is obvious that the test is inconvenient because a dedicated test seat (70) has to be made and each to-be-tested oscillator unit (90) has to be positioned in and taken away from the test seat (70) manually. Therefore, there is a need to provide a new and improved oscillator structure to remove the inconvenience and complexity in testing.

SUMMARY OF THE INVENTION

The objective of the present invention is to provide a modular high-frequency oscillator structure that uses a master circuit board to form multiple oscillator units. All oscillator units are tested directly on the master circuit board thereby eliminating use of a dedicated test seat to test the oscillator units one by one.

To achieve the objective, the master circuit board of the modular high-frequency oscillator structure comprises an upper copper foil layer, a middle copper foil layer separated from the upper copper foil layer by a first isolation layer, and a lower copper foil layer separated from the middle copper foil layer by a second isolation layer. The upper copper foil layer has a plurality of component circuit patterns and a plurality of positive voltage, ground and signal regulation circuit patterns. Each component circuit pattern provides circuit connections for one oscillator unit. The plurality of positive voltage and ground circuit patterns are provided to supply external power to each oscillator unit. The plurality of signal regulation circuit patterns are provided to apply regulation signals to each oscillator unit. The middle copper foil layer has a plurality of power transfer and ground transfer circuit patterns to electrically connect the plurality of positive voltage and ground circuit patterns to the plurality of oscillator units. The lower copper foil layer has a large common ground circuit pattern electrically connected to the plurality of ground circuit patterns of the upper copper foil layer and the plurality of ground transfer circuit patterns of the middle copper foil layer. The master circuit board is etched in such a manner that the upper and lower copper foil layers are cut through and the middle copper foil layer remains uncut whereby each oscillator is isolated and can be tested directly on said master circuit board.

Other objectives, advantages, and novel features of the invention will become more apparent from the following detailed description when taken in conjunction with the accompanying drawings.

DETAILED DESCRIPTION OF THE PREFERRED EMBODIMENT

Figure 1A:
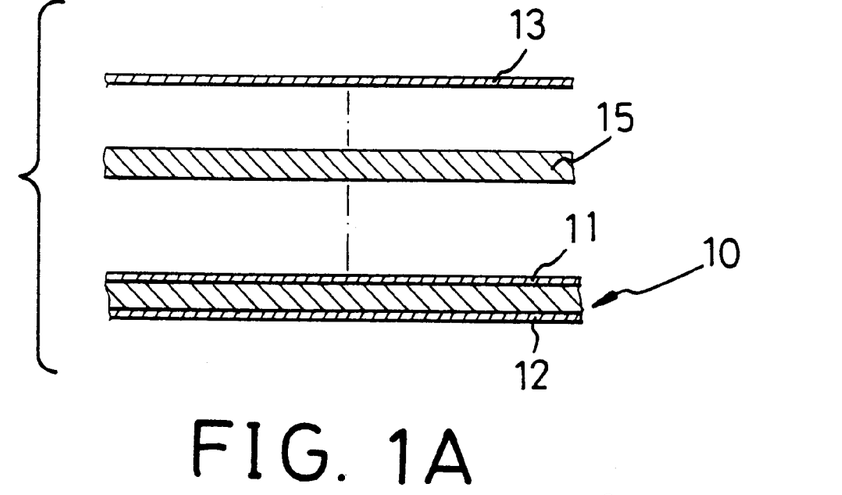
FIGS. 1A–1C schematically illustrate the process for forming a master circuit board with three copper foil layers of the high-frequency oscillator structure in accordance with the present invention.
Figure 1B:
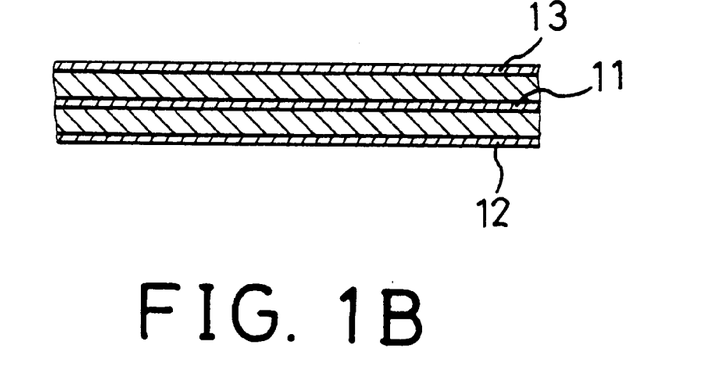
Figure 1C:
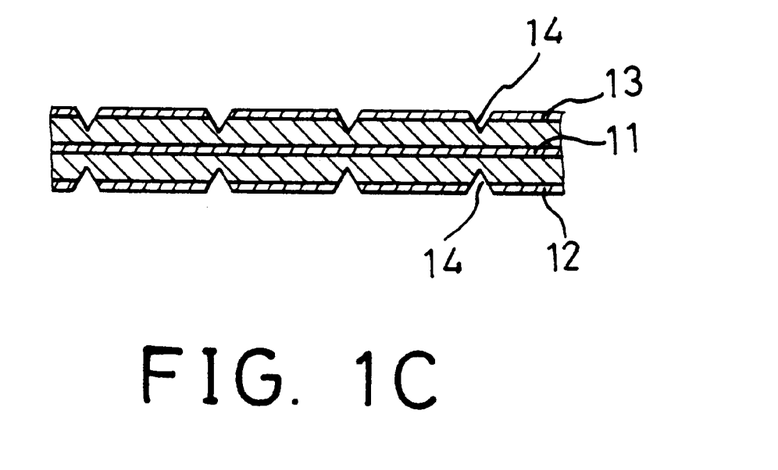

The modular high-frequency oscillator structure in accordance with the present invention provides a master circuit board to form multiple oscillator units. The process to form the master circuit board is shown in FIG. 1. As illustrated in FIG. 1A, a circuit board (10) is provided with a first isolation layer having an upper face and a lower face respectively formed thereon a copper foil layer (11,12). A second isolation layer (15), which has a thickness equal to that of the first isolation layer, and a copper foil layer (13) are sequentially stacked and bonded onto the circuit board (10). Accordingly, a master circuit board with three copper foil layers (11,12, 13) is obtained as shown in FIG. 1B. The upper copper foil layer (13) is used primarily to form multiple component circuit patterns corresponding to the oscillator units. The middle copper foil layer (11) is used to form multiple power and ground transfer circuit patterns and signal transfer circuit patterns corresponding to the oscillator units. The lower copper foil layer (12) is used to form a common ground circuit pattern for the oscillator units. An etching process is then undertaken on the master circuit board after electronic components have been soldered to the master circuit board thereby defining the area for each oscillator unit wherein-the etching knife employed is provided with a V-shaped knife edge and properly controlled such that the middle copper foil layer (11) is not cut. As shown in FIG. 1C, a plurality of V-shaped etched grooves (14) are defined in the faces of the master circuit board by the etching process and only the upper and lower copper foil layers (13,12) are cut. As a result, each oscillator unit is isolated from the others and can be easily separated from the master circuit board afterwards by breaking the master circuit board along the plurality of grooves (14).

The most important feature is that the positive voltage and ground circuit patterns (VCC,GND) and signal regulation circuit pattern (VT) of each oscillator unit are electrically connected to all oscillator units. To accomplish this, there are a plurality of through holes (139) defined in predetermined positions of the master circuit board, the inner surface of each through hole (139) coated with conductive material. Because the plurality of through holes (139) are defined through the three copper foil layers (13,11,12), the three copper foil layers (13,11,12) are electrically connected. Further because the middle copper foil layer (11) is uncut, the power and the regulation signals can be directed to each oscillator unit on the master circuit board. Accordingly, by supplying power and applying regulation signals to the master circuit board, all the oscillator units on the master circuit board are powered up and operated. Therefore, each oscillator unit can be tested directly on the master circuit board thereby enhancing the test performance by eliminating the need for using the dedicated test seat (70) and the steps of positioning each oscillator unit into and removing it from the test seat (70).

Figure 2A:
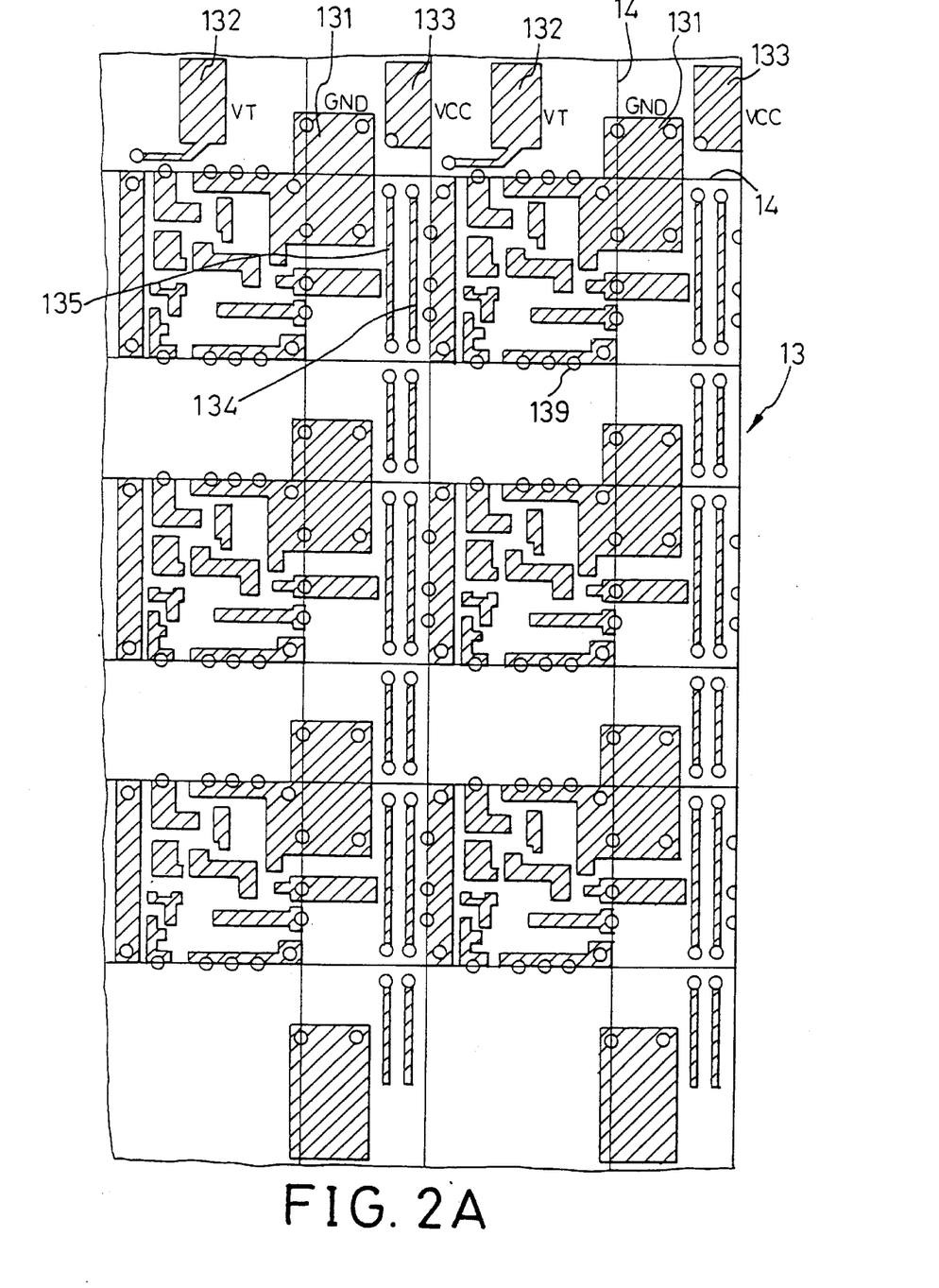
FIG. 2A is the plan view of the upper copper foil layer of the master circuit board.
Figure 2B:
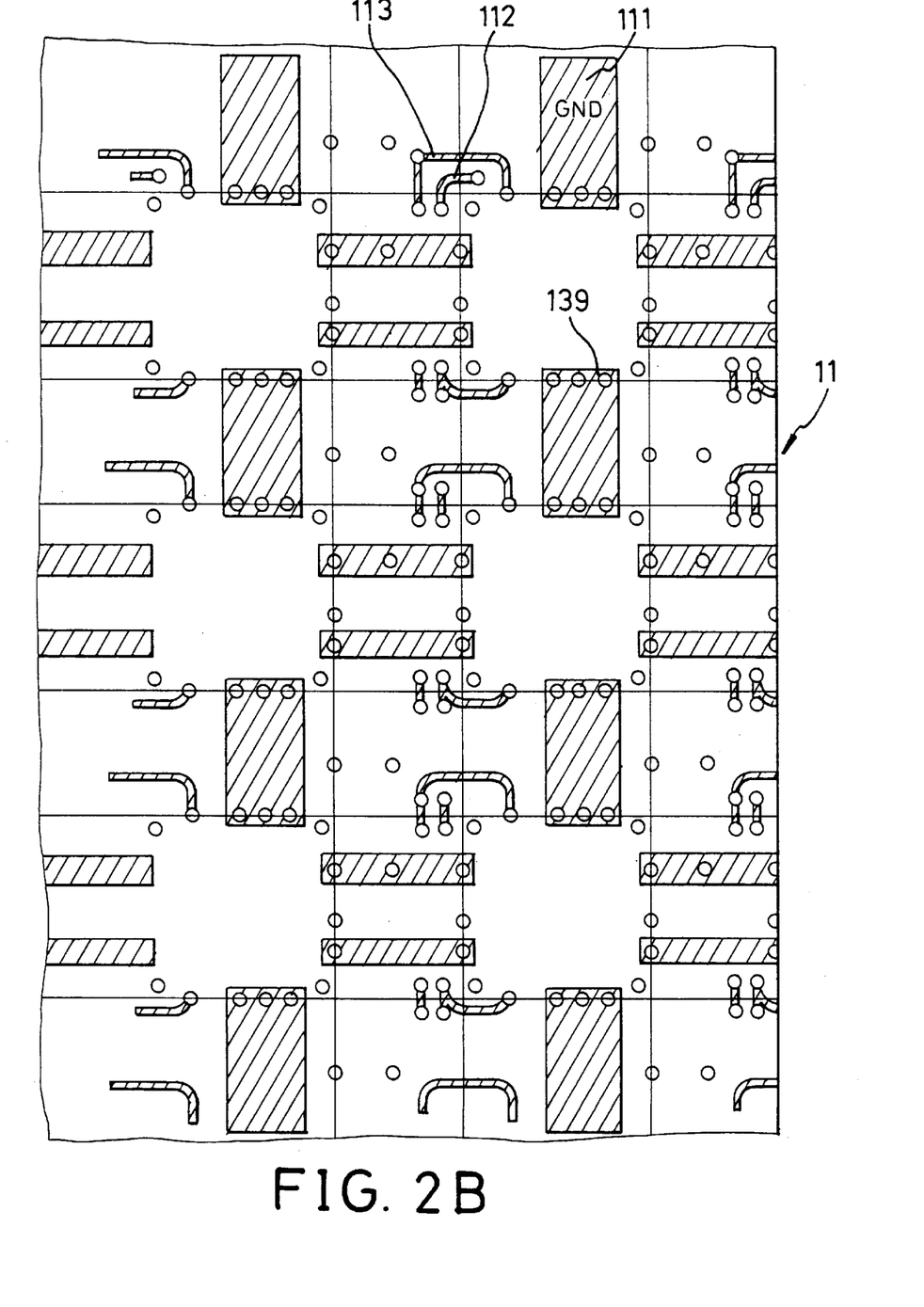
FIG. 2B is the plan view of the middle copper foil layer of the master circuit board.
Figure 2C:
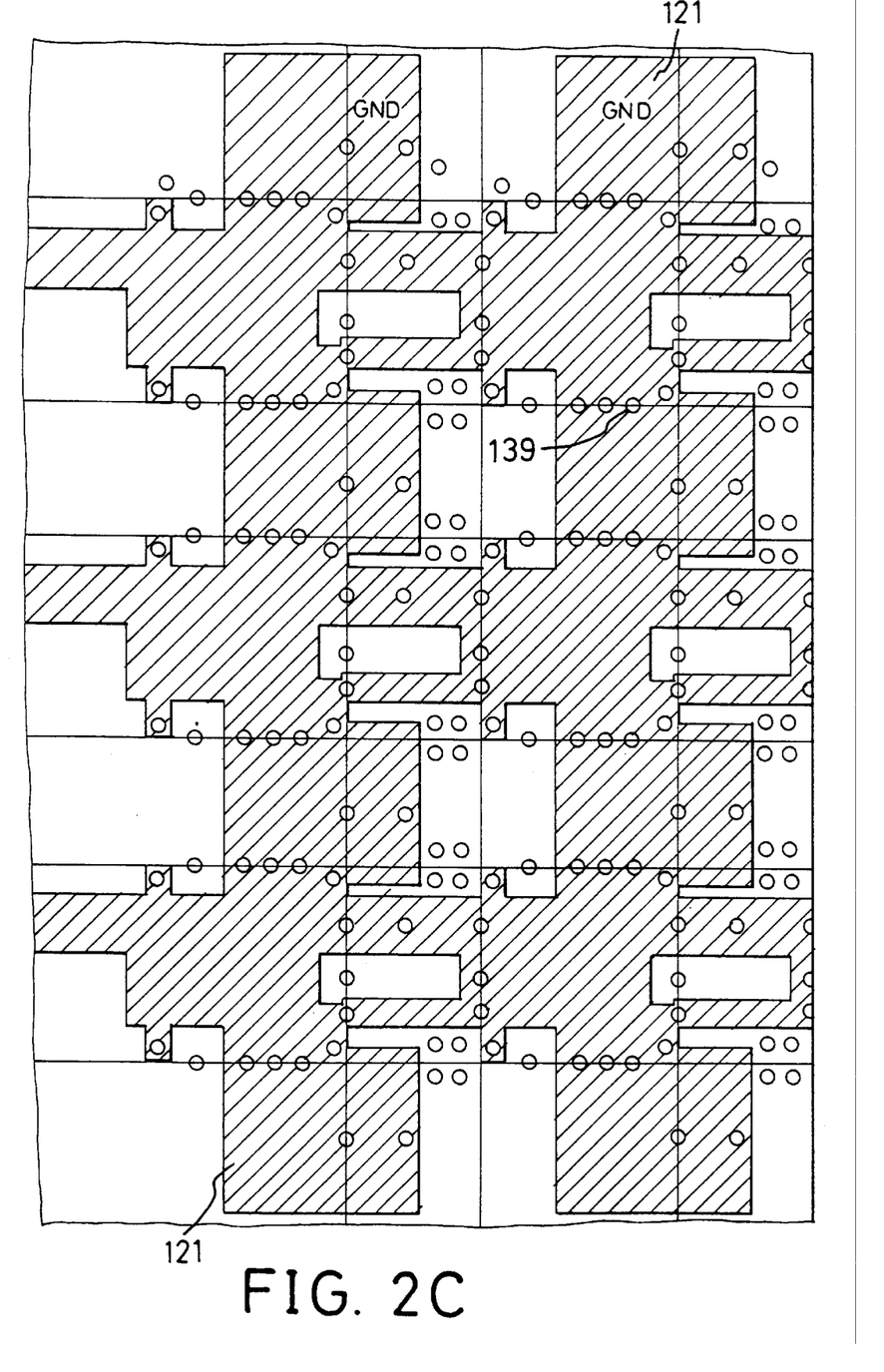
FIG. 2C is the plan view of the lower copper foil layer of the master circuit board.

The circuit patterns formed by the three copper foil layers (11,12,13) of the master circuit board are designed with respect to each other. FIGS. 2A, 2B and 2C show the circuit patterns of the three copper foil layers. Referring to FIG. 2A for the circuit pattern of the upper copper foil layer (13) (component circuit pattern), the plurality of intersected vertical and horizontal etched grooves (14) are provided to define a plurality of substantially square areas, each having a complicated component circuit pattern for providing electrically connections among various electronic components of an oscillator unit. One oscillator unit is positioned in each square area. The other area of the master circuit board is used for manufacturing and testing purposes. There are ground, positive voltage and signal regulation circuit patterns (131,133,132) shown and also denoted by GND, VCC and VT, respectively, for connecting to the ground, positive voltage and signal regulation terminals, respectively, during a test. Via these terminals, external power and regulation signals can be applied to each oscillator unit (In this preferred embodiment, only those oscillator units arranged in a vertical line are shown to be connected). Therefore, only one power source is required to power up all the oscillator units. In addition, a plurality of strip shaped signal jump circuit patterns (134,135) are shown in FIG. 2A for signal jumping, which will be described in detail later.

Figure 3:
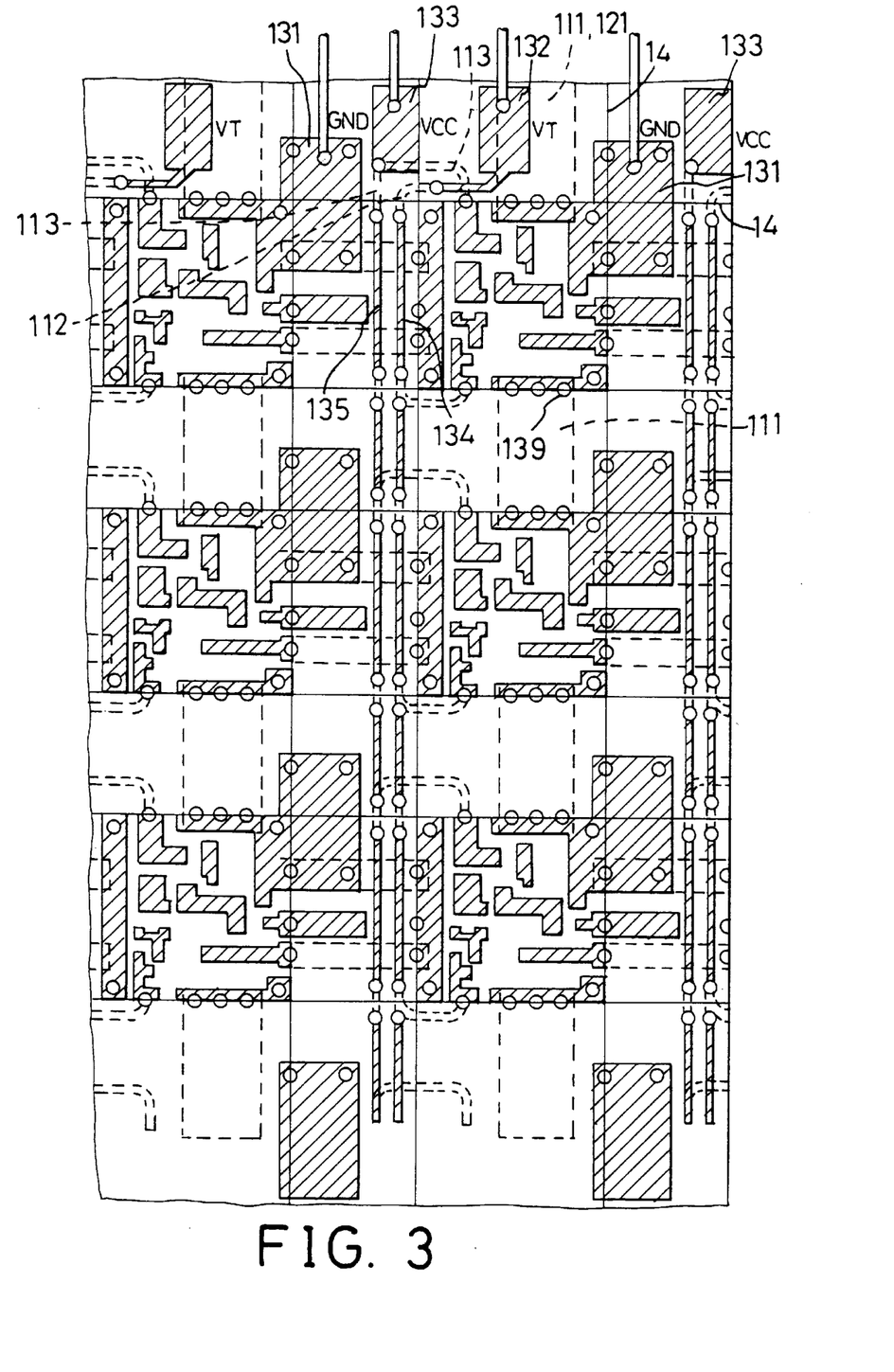
FIG. 3 schematically illustrates the upper copper foil layer overlaying the middle copper foil layer.

FIG. 2B shows the circuit pattern of the middle copper foil layer (11) (power circuit pattern) which provides a plurality of ground, signal and power transfer circuit patterns (111,112,113) to connect the ground circuit pattern (131) (also denoted by GND), signal regulation circuit pattern (132) (also denoted by VT) and positive voltage circuit pattern (133) (also denoted by VCC), shown in FIG. 2A, of each oscillator unit to those of another oscillator unit. Referring to FIG. 2C, the lower copper foil layer (12) forms a large common ground circuit pattern (121). FIG. 3 is formed by overlapping FIG. 2A and FIG. 2B, wherein the phantom lines stand for the circuit patterns of the middle copper foil layer (11). It is shown that the ground circuit pattern (131) of the upper copper foil layer (13), the ground transfer circuit pattern (111) of the middle copper foil layer (11) and the common ground circuit pattern (121) of the lower copper foil layer (12) are electrically connected. The positive voltage circuit pattern (133) (also denoted by VCC) of the upper copper foil layer (13) is connected to the oscillator unit and the strip shaped jump circuit pattern (135) therebelow via the power transfer circuit pattern (113) of the middle copper foil layer (11) whereby the positive voltage circuit pattern (133) (also denoted by VCC) is further connected downward to other oscillator units in a similar manner. The regulation signal circuit pattern (132) (also denoted by VT) of the upper copper foil layer (13) is extendedly connected to the oscillator units via the signal transfer circuit patterns (112) of the middle copper foil layer (11) and the strip shaped signal jump circuit pattern (134) of the upper copper foil layer (13). When the upper and lower copper foil layers (13,12) are cut to define the plurality of intersected vertical and horizontal etched grooves (14) in the master circuit board, the ground, positive voltage and signal regulation circuit patterns (131,133,132) of the upper copper foil layer (13) remain electrically connected to the respective oscillator units via the middle copper foil layer (11) thereby enabling the operation of the oscillator units. Therefore, by connecting conductive wires to the positive voltage, signal regulation and ground circuit patterns (133,132,131) (also denoted by VCC, VT, GND) shown at the upper portion of FIG. 3 for applying proper power and signals thereto, each oscillator unit can be tested directly on the master circuit board.

Although the present invention has been explained in relation to its preferred embodiment, it is to be understood that many other possible modifications and variations can be made without departing from the spirit and scope of the invention as hereinafter claimed.

What is claimed is:

1. A modular high-frequency oscillator structure having a master circuit board for forming a plurality of oscillator units, said master circuit board comprising:

an upper copper foil layer having a plurality of component circuit patterns and a plurality of positive voltage, ground and signal regulation circuit patterns, wherein each component circuit pattern provides circuit connections for one oscillator unit, said plurality of positive voltage and ground circuit patterns being provided for supplying external power to each oscillator unit, said plurality of signal regulation circuit patterns being provided for applying regulation signals to each oscillator unit;

a middle copper foil layer having a plurality of power transfer and ground transfer circuit patterns for electrically connecting said plurality of positive voltage and ground circuit patterns to said plurality of oscillator units;

a first isolation layer provided between said upper and middle copper foil layers;

a lower copper foil layer having a large common ground circuit pattern electrically connected to the plurality of ground circuit patterns of said upper copper foil layer and the plurality of ground transfer circuit patterns of said middle copper foil layer; and a second isolation layer provided between said middle and lower copper foil layers, wherein said master circuit board is etched in such a manner that said upper and lower copper foil layers are cut through to isolate each oscillator unit and said middle copper foil layer remains uncut whereby each oscillator can be tested directly on said master circuit board.

2. The modular high-frequency oscillator structure as claimed in claim 1, wherein said first isolation layer has a thickness equal to that of said second isolation layer.

3. The modular high-frequency oscillator structure as claimed in claim 1, wherein said upper, middle and lower copper foil layers are equally spaced.

4. The modular high-frequency oscillator structure as claimed in claim 1, wherein said master circuit board is etched by a etching knife with a V-shaped knife edge.

5. The modular high-frequency oscillator structure as claimed in claim 1, wherein said middle copper foil layer further has a plurality of signal transfer circuit patterns for electrically connecting said plurality of signal regulation circuit patterns to said plurality of oscillator units.

6. The modular high-frequency oscillator structure as claimed in claim 5, wherein said upper copper coil layer further has a plurality of signal jump circuit patterns for electrically connecting said plurality of power transfer and signal transfer circuit patterns.

7. The modular high-frequency oscillator structure as claimed in claim 1, wherein said master circuit board has a plurality of through holes defined therein, each having an inner surface coated with conductive material, whereby said upper, middle and lower copper foil layers are electrically connected.

* * * * *